(12) United States Patent
Han

(10) Patent No.: US 10,902,931 B2
(45) Date of Patent: Jan. 26, 2021

(54) SHIFT REGISTER UNIT AND METHOD FOR DRIVING THE SAME, GATE DRIVING CIRCUIT, AND DISPLAY APPARATUS

(71) Applicant: BOE Technology Group Co., Ltd., Beijing (CN)

(72) Inventor: Mingfu Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/556,485

(22) Filed: Aug. 30, 2019

(65) Prior Publication Data
US 2020/0135287 A1 Apr. 30, 2020

(30) Foreign Application Priority Data
Oct. 26, 2018 (CN) .......................... 2018 1 1259374

(51) Int. Cl.
*G09G 3/36* (2006.01)
*G06F 3/038* (2013.01)
*G09G 5/00* (2006.01)
*G11C 19/28* (2006.01)
*G09G 3/3266* (2016.01)

(52) U.S. Cl.
CPC .......... *G11C 19/28* (2013.01); *G09G 3/3266* (2013.01); *G09G 3/3677* (2013.01); *G09G 2310/0286* (2013.01); *G09G 2310/08* (2013.01)

(58) Field of Classification Search
CPC . G09G 2310/0286; G09G 3/3677; G09G 3/20
See application file for complete search history.

(56) References Cited

U.S. PATENT DOCUMENTS

| 10,622,081 | B2 | 4/2020 | Gu et al. |
| 2008/0100560 | A1 | 5/2008 | Na et al. |
| 2011/0010686 | A1 | 1/2011 | Wilson et al. |

(Continued)

FOREIGN PATENT DOCUMENTS

| CN | 105427825 A | * 3/2016 | ........... G11C 19/184 |
| CN | 106531052 A | 3/2017 | |

(Continued)

OTHER PUBLICATIONS

Office Action, including Search Report, for Chinese Patent Application No. 201811259374.X, dated Apr. 15, 2020, 14 pages.

*Primary Examiner* — Nan-Ying Yang
(74) *Attorney, Agent, or Firm* — Westman, Champlin & Koehler, P.A.

(57) ABSTRACT

The present disclosure provides a shift register unit and a method for driving the same, a gate driving circuit, and a display apparatus. The shift register unit includes: a first input sub-circuit configured to transmit a signal at a first signal input terminal to a pull-up node under control of the first signal input terminal; a second input sub-circuit configured to transmit the signal at the first signal input terminal to the pull-up node under control of a second signal input terminal; a first output sub-circuit configured to transmit a signal at a first clock signal terminal to a first signal output terminal under control of the pull-up node; and a second output sub-circuit configured to transmit a signal at a second clock signal terminal to a second signal output terminal under control of the pull-up node.

19 Claims, 9 Drawing Sheets

(56) References Cited

U.S. PATENT DOCUMENTS

| | | | | |
|---|---|---|---|---|
| 2013/0169609 A1* | 7/2013 | Son | ............ | G09G 5/00 |
| | | | | 345/209 |
| 2015/0371716 A1* | 12/2015 | Shao | ............ | G11C 19/287 |
| | | | | 345/100 |
| 2016/0358666 A1 | 12/2016 | Pang | | |
| 2018/0190364 A1 | 7/2018 | Gu et al. | | |
| 2018/0301101 A1* | 10/2018 | Hu | ............ | G09G 3/3677 |

FOREIGN PATENT DOCUMENTS

| CN | 108682380 A | 10/2018 |
|---|---|---|
| KR | 10-2015-0070840 A | 6/2015 |

* cited by examiner

SHIFT REGISTER UNIT AND METHOD FOR DRIVING THE SAME, GATE DRIVING CIRCUIT, AND DISPLAY APPARATUS

CROSS-REFERENCE TO RELATED APPLICATION(S)

This application claims priority to the Chinese Patent Application No. 201811259374.X, filed on Oct. 26, 2018, which is incorporated herein by reference in its entirety.

TECHNICAL FIELD

The present disclosure relates to the field of display technology, and more particularly, to a shift register unit and a method for driving the same, a gate driving circuit, and a display apparatus.

BACKGROUND

In recent years, the development of displays has shown a trend of high integration and low cost. The Gate Driver On Array (GOA) technology integrates a gate driving circuit comprising a plurality of shift register units on a display panel, thereby reducing the product cost in terms of material cost and manufacturing process etc. Conventionally, in order to ensure a pixel charging rate, a high driving voltage is used in the shift register unit. This may result in an unstable voltage at a pull-up node in the shift register unit, thereby affecting the display.

SUMMARY

According to an aspect of the embodiments of the present disclosure, there is provided a shift register unit, comprising:

a first input sub-circuit connected to a first signal input terminal and a pull-up node, and configured to transmit a signal at the first signal input terminal to the pull-up node under control of the first signal input terminal;

a second input sub-circuit connected to a second signal input terminal, the first signal input terminal, and the pull-up node, and configured to transmit the signal at the first signal input terminal to the pull-up node under control of the second signal input terminal;

a first output sub-circuit connected to the pull-up node, a first clock signal terminal, and a first signal output terminal, and configured to transmit a signal at the first clock signal terminal to the first signal output terminal under control of the pull-up node; and a second output sub-circuit connected to the pull-up node, a second clock signal terminal, and a second signal output terminal, and configured to transmit a signal at the second clock signal terminal to the second signal output terminal under control of the pull-up node.

In an example, the shift register unit further comprises a reset sub-circuit connected to a reset signal terminal, the first signal input terminal, and the pull-up node, and configured to transmit the signal at the first signal input terminal to the pull-up node under control of the reset signal terminal.

In an example, the shift register unit further comprises:

a first de-noising sub-circuit connected to a first pull-down node, the pull-up node, and the first signal input terminal, and configured to transmit the signal at the first signal input terminal to the pull-up node under control of the first pull-down node.

In an example, the shift register unit further comprises:

a second de-noising sub-circuit connected to a second pull-down node, the pull-up node, and the first signal input terminal, and configured to transmit the signal at the first signal input terminal to the pull-up node under control of the second pull-down node.

In an example, the shift register unit further comprises:

a first pull-down control sub-circuit connected to the pull-up node, a first voltage terminal, a second voltage terminal, and a first pull-down node, and configured to control a level at the first pull-down node based on levels at the first voltage terminal and the second voltage terminal under control of the pull-up node;

a first pull-down sub-circuit connected to the first pull-down node, the first signal output terminal, and a third voltage terminal, and configured to transmit a signal at the third voltage terminal to the first signal output terminal under control of the first pull-down node; and a second pull-down sub-circuit connected to the first pull-down node, the second signal output terminal, and the second voltage terminal, and configured to transmit a signal at the second voltage terminal to the second signal output terminal under control of the first pull-down node.

In an example, the shift register unit further comprises:

a second pull-down control sub-circuit connected to the pull-up node, a fourth voltage terminal, the second voltage terminal, and a second pull-down node, and configured to control a level at the second pull-down node based on levels at the fourth voltage terminal and the second voltage terminal under control of the pull-up node;

a third pull-down sub-circuit connected to the second pull-down node, the first signal output terminal, and the third voltage terminal, and configured to transmit the signal at the third voltage terminal to the first signal output terminal under control of the second pull-down node; and a fourth pull-down sub-circuit connected to the second pull-down node, the second signal output terminal, and the second voltage terminal, and configured to output the signal at the second voltage terminal to the second signal output terminal under control of the second pull-down node.

In an example, the first input sub-circuit comprises a first transistor having a gate connected to the first signal input terminal, a first electrode connected to the first signal input terminal, and a second electrode connected to the pull-up node.

In an example, the second input sub-circuit comprises a second transistor having a gate connected to the second signal input terminal, a first electrode connected to the pull-up node, and a second electrode connected to the first signal input terminal.

In an example, the first output sub-circuit comprises a third transistor and a storage capacitor, wherein the third transistor has a gate connected to the pull-up node, a first electrode connected to the first clock signal terminal, and a second electrode connected to the first signal output terminal; and the storage capacitor has a first terminal connected to the pull-up node, and a second terminal connected to the first signal output terminal.

In an example, the second output sub-circuit comprises a fourth transistor having a gate connected to the pull-up node, a first electrode connected to the second clock signal terminal, and a second electrode connected to the second signal output terminal.

In an example, the reset sub-circuit comprises a fifth transistor, wherein the fifth transistor has a gate connected to the reset signal terminal, a first electrode connected to the pull-up node, and a second electrode connected to the first signal input terminal.

In an example, the first de-noising sub-circuit comprises a sixth transistor having a gate connected to the first pull-down node, a first electrode connected to the pull-up node, and a second electrode connected to the first signal input terminal.

In an example, the second de-noising sub-circuit comprises a seventh transistor having a gate connected to the second pull-down node, a first electrode connected to the pull-up node, and a second electrode connected to the first signal input terminal.

In an example, the first pull-down control sub-circuit comprises an eighth transistor, a ninth transistor, a tenth transistor, and an eleventh transistor, the first pull-down sub-circuit comprises a twelfth transistor, and the second pull-down sub-circuit comprises a thirteenth transistor, wherein the eighth transistor has a gate connected to the first voltage terminal, a first electrode connected to the first voltage terminal, and a second electrode connected to a gate of the ninth transistor and a first electrode of the tenth transistor;

the ninth transistor has the gate also connected to the first electrode of the tenth transistor, a first electrode connected to the first voltage terminal, and a second electrode connected to the first pull-down node;

the tenth transistor has a gate connected to the pull-up node, and a second electrode connected to the second voltage terminal;

the eleventh transistor has a gate connected to the pull-up node, a first electrode connected to the first pull-down node, and a second electrode connected to the second voltage terminal;

the twelfth transistor has a gate connected to the first pull-down node, a first electrode connected to the first signal output terminal, and a second electrode connected to the third voltage terminal; and the thirteenth transistor has a gate connected to the first pull-down node, a first electrode connected to the second signal output terminal, and a second electrode connected to the second voltage terminal.

In an example, the second pull-down control sub-circuit comprises a fourteenth transistor, a fifteenth transistor, a sixteenth transistor, and a seventeenth transistor, the third pull-down sub-circuit comprises an eighteenth transistor, and the fourth pull-down sub-circuit comprises a nineteenth transistor, wherein the fourteenth transistor has a gate connected to the fourth voltage terminal, a first electrode connected to the fourth voltage terminal, and a second electrode connected to a gate of the fifteenth transistor;

the fifteenth transistor has the gate also connected to a first electrode of the sixteenth transistor, a first electrode connected to the fourth voltage terminal, and a second electrode connected to the second pull-down node;

the sixteenth transistor has a gate connected to the pull-up node, and a second electrode connected to the second voltage terminal;

the seventeenth transistor has a gate connected to the pull-up node, a first electrode connected to the second pull-down node, and a second electrode connected to the second voltage terminal;

the eighteenth transistor has a gate connected to the second pull-down node, a first electrode connected to the first signal output terminal, and a second electrode connected to the third voltage terminal; and the nineteenth transistor has a gate connected to the second pull-down node, a first electrode connected to the second signal output terminal, and a second electrode connected to the second voltage terminal.

According to another aspect of the embodiments of the present disclosure, there is provided a gate driving circuit, comprising N stages of cascaded shift register units described above, wherein a first signal input terminal of an $n^{th}$ stage of shift register unit is connected to a second signal output terminal of an $(n-1)^{th}$ stage of shift register unit, and a second signal input terminal of the $n^{th}$ stage of shift register unit is connected to a second signal output terminal of an $(n+1)^{th}$ stage of shift register unit; and a first clock signal terminal of the $n^{th}$ stage of shift register unit is connected to receive a first clock signal, and a second clock signal terminal of the $n^{th}$ stage of shift register unit is connected to receive a second clock signal, where n and N are integers greater than 1, and $2 \le n \le N-1$.

According to yet another aspect of the embodiments of the present disclosure, there is provided a display apparatus, comprising the gate driving circuit described above.

According to a further aspect of the embodiments of the present disclosure, there is provided a method for driving the shift register unit described above, comprising:

in an input phase, applying a first input signal at a first level to the first signal input terminal, so that the first input sub-circuit transmits the first level at the first signal input terminal to the pull-up node;

in a first output phase, applying a first clock signal at the first level to the first clock signal terminal, and applying a second clock signal at the first level to the second clock signal terminal, so that the first output sub-circuit transmits the first level at the first clock signal terminal to the first signal output terminal and the second output sub-circuit transmits the first level at the second clock signal terminal to the second signal output terminal under action of a potential at the pull-up node;

in a second output phase in which the input signal becomes a second level, the first clock signal becomes the second level, and the second clock signal is maintained at the first level, transmitting, by the first output sub-circuit, the second level at the first clock signal terminal to the first signal output terminal and transmitting, by the second output sub-circuit, the first level at the second clock signal terminal to the second signal output terminal under action of the potential at the pull-up node; and in a pull-down phase in which the second clock signal becomes the second level, applying a second input signal at the first level to the second signal input terminal, so that the second input sub-circuit inputs the second level at the first signal input terminal to the pull-up node, and the first output sub-circuit and the second output sub-circuit are turned off under action of the potential at the pull-up node.

In an example, the shift register unit comprises a reset sub-circuit, and the method for driving a shift register unit further comprises:

in a reset phase in which the first input signal at the first signal input terminal is at the second level, applying a reset signal at the first level to the reset signal terminal, so that the reset sub-circuit transmits the second level at the first signal input terminal to the pull-up node, and the first output sub-circuit and the second output sub-circuit are turned off under action of the potential at the pull-up node.

In an example, the shift register unit comprises a first de-noising sub-circuit, and the method further comprises: in the pull-down phase, transmitting, by the first de-noising sub-circuit, the second level at the first signal input terminal to the pull-up node under control of the first pull-down node; or the shift register unit comprises a first de-noising sub-circuit and a second de-noising sub-circuit, and the method further comprises: in the pull-down phase, transmitting, by the first de-noising sub-circuit, the second level at the first signal input terminal to the pull-up node under control of the first pull-down node; or transmitting, by the second de-noising sub-circuit, the second level at the first signal input terminal to the pull-up node under control of the second pull-down node.

BRIEF DESCRIPTION OF THE ACCOMPANYING DRAWINGS

DETAILED DESCRIPTION

The technical solutions in the embodiments of the present disclosure will be clearly and completely described below in conjunction with the accompanying drawings in the embodiments of the present disclosure. Obviously, the embodiments described are merely a part of the embodiments of the present disclosure instead of all the embodiments. All other embodiments obtained by those of ordinary skill in the art based on the embodiments of the present disclosure without any creative work are within the protection scope of the present disclosure.

In addition, in the description of the embodiments of the present disclosure, the terms "first level" and "second level" are only used to distinguish magnitudes of the two levels from each other. For example, the following description is made by taking the "first level" being a low level and the "second level" being a high level as an example. It may be understood by those skilled in the art that the present disclosure is not limited thereto.

The transistors used in the embodiments of the present disclosure may each be a thin film transistor or a field effect transistor or other devices having the same characteristics. Preferably, the thin film transistor used in the embodiments of the present disclosure may be an oxide semiconductor transistor. Since a source and a drain of the thin film transistor used herein are symmetrical, the source and the drain thereof may be interchanged. In the embodiments of the present disclosure, one of the source and the drain is referred to as a first electrode, and the other of the source and the drain is referred to as a second electrode. In the following examples, the description is made by taking an N-type thin film transistor as an example. It may be understood by those skilled in the art that the embodiments of the present disclosure may obviously applied to a case of a P-type thin film transistor.

Figure 1:
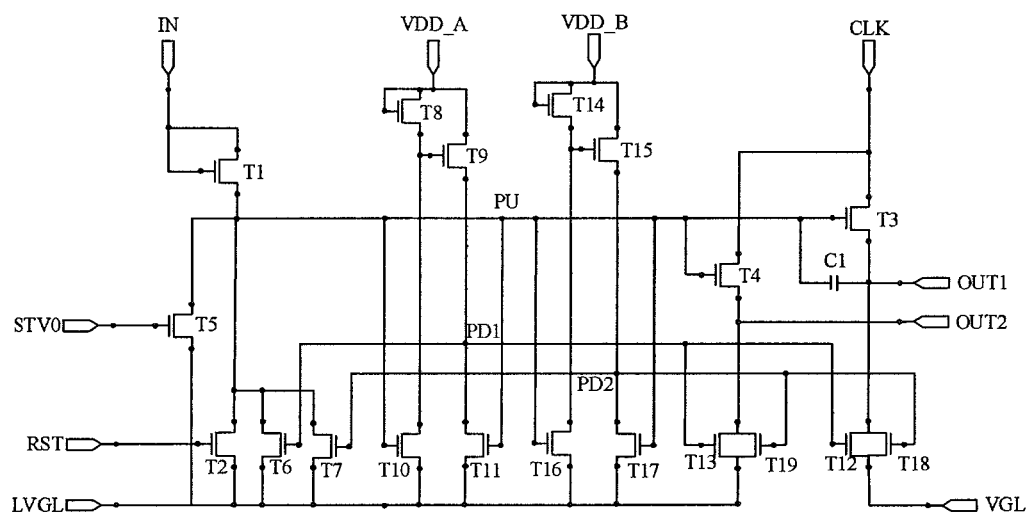
FIG. 1 is a schematic structural diagram of a shift register unit.
Figure 2A:
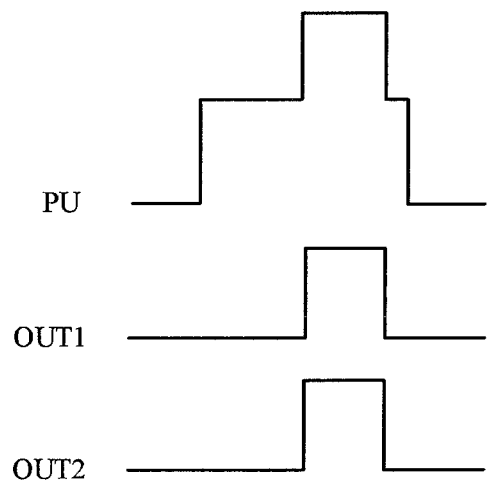
FIG. 2a is a diagram of ideal signal waveforms at a pull-up node and a signal output terminal in the shift register unit of FIG. 1.
Figure 2B:
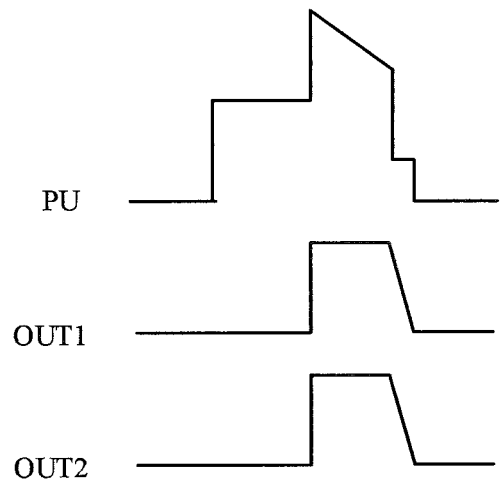
FIG. 2b is a diagram of actual signal waveforms at the pull-up node and the signal output terminal in the shift register unit of FIG. 1.

FIG. 1 is a schematic structural diagram of a shift register unit. FIG. 2a is a diagram of ideal signal waveforms at a pull-up node and a signal output terminal in the shift register unit of FIG. 1. FIG. 2b is a diagram of actual signal waveforms at the pull-up node and the signal output terminal in the shift register unit of FIG. 1.

In a display driving process, as shown in FIG. 2a, a voltage at the pull-up node in the shift register unit rises twice, so that the voltage at the pull-up node may increase nearly two times to a high level, which causes each of thin film transistors (such as transistors T2, T6, T7, and T5 in FIG. 1) for discharging the pull-up node has a significantly increased source-drain voltage. When a high level VGH is greater than 30V, the source-drain voltage may reach 70V or more, thereby generating leakage current flowing through the thin film transistor, which results in that the voltage at the pull-up node may not be maintained. For example, if the high level VGH applied to power signal terminals (for example, power signal terminals VDD_A and VDD_B in FIG. 1) of the shift register unit is 36V and a low level applied to a reference signal terminal (for example, a reference signal terminal LVGL in FIG. 1) of the shift register unit is −15V, when the shift register unit operates, the voltage at the pull-up node PU is greater than 60V, and the source-drain voltage Vds of each of the transistors T2, T6, T7 and T5 reaches 70V or more. For a transistor with an aspect ratio of 1000 u/3 u, leakage current of the transistor increases as Vds increases. When Vds increases to about 70 v, the leakage current may reach an order of 10E-6, and the transistor is in a turn-on state. If leakage current of the transistor is initially large, the leakage current is more obvious after the source-drain voltage rises. Therefore, when the source-drain voltage Vds of each of the above four transistors reaches 70V, the leakage current of each of the transistors T2, T6, T7 and T5 may reach an order of 10E-6, which results in that the voltage at the pull-up node PU may not be normally maintained, and the voltage at the pull-up node PU drops rapidly due to the leakage current.

The pull-up node PU acts on gates of the transistors T3 and T4, and the potential at the pull-up node PU determines the degree of turn-on of the transistors T3 and T4, thereby determining charging and discharging speeds at signal output terminals OUT1 and OUT2. If the potential at the pull-up node PU may not be maintained, it may affect the discharging speeds at the signal output terminals OUT1 and OUT2. If the signal output terminals OUT1 and OUT2 may not be completely discharged due to the decrease in potential at the pull-up node PU, the signal output terminals OUT1 and OUT2 may be discharged by a pull-down node PD1 or PD2. That is, the signal output terminal OUT1 is discharged by a transistor T12 or T18, and the signal output terminal OUT2 is discharged by a transistor T13 or T19. Since the above transistors T2, T6, T7 and T5 are generally smaller than the transistors T3 and T4 in size, the discharging speeds at the signal output terminals OUT1 and OUT2 are slow, which results in delays of signals at the signal output terminals OUT1 and OUT2, thereby causing an obvious crosstalk in a pixel region. As shown in FIG. 2b, the voltage at the pull-up node PU may not be maintained due to the leakage current, so that the voltage at the pull-up node PU becomes low at falling edges of the output signals at the signal output terminals OUT1 and OUT2, which may affect the discharging speeds at the signal output terminals, i.e., affecting output waveforms. Thereby, it causes delays of gate scanning signals output at the signal output terminals, thus resulting in poor display.

Embodiments of the present disclosure provide a shift register unit and a method for driving the same, a gate driving circuit, and a display apparatus, which may improve the problem of poor display due to delays of gate scanning signals output at signal output terminals which is caused by a decrease in potential at a pull-up node due to electrical leakage.

Figure 3:
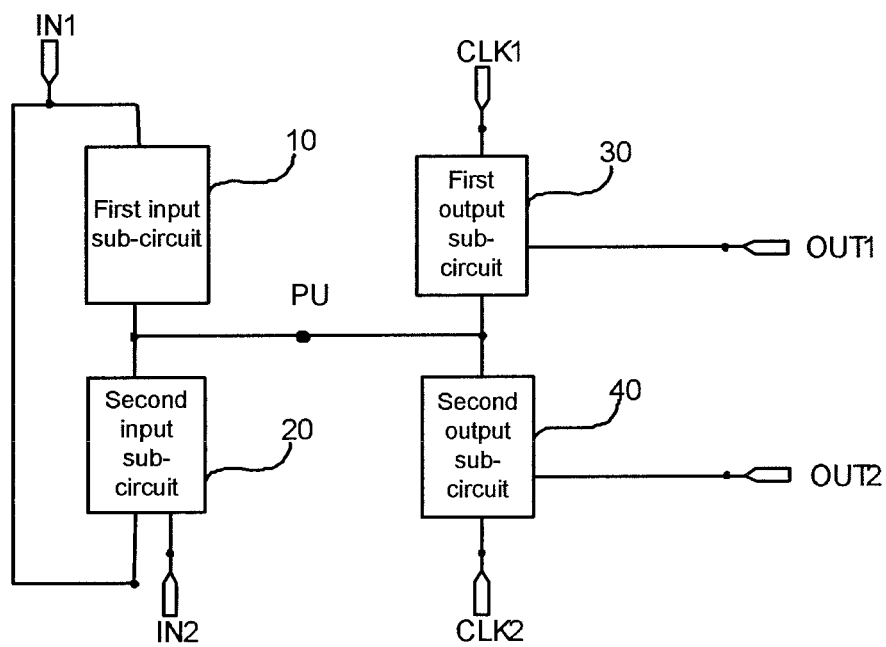
FIG. 3 is a schematic structural diagram of a shift register unit according to an embodiment of the present disclosure.

FIG. 3 is a schematic structural diagram of a shift register unit according to an embodiment of the present disclosure. As shown in FIG. 3, the shift register unit comprises a first input sub-circuit 10, a second input sub-circuit 20, a first output sub-circuit 30, and a second output sub-circuit 40.

The first input sub-circuit 10 is connected to a first signal input terminal IN1 and a pull-up node PU, and may transmit a signal at the first signal input terminal IN1 to the pull-up node PU under control of the first signal input terminal IN1.

The second input sub-circuit 20 is connected to a second signal input terminal IN2, the first signal input terminal IN1 and the pull-up node PU, and may transmit the signal at the first signal input terminal IN1 to the pull-up node PU under control of the second signal input terminal IN2.

The first output sub-circuit 30 is connected to the pull-up node PU, a first clock signal terminal CLK1, and a first signal output terminal OUT1, and may transmit a signal at the first clock signal terminal CLK1 to the first signal output terminal OUT1 under control of the pull-up node PU.

The second output sub-circuit 40 is connected to the pull-up node PU, a second clock signal terminal CLK2, and a second signal output terminal OUT2, and may transmit a signal at the second clock signal terminal CLK2 to the second signal output terminal OUT2 under control of the pull-up node PU.

In the shift register unit according to the present disclosure, the second input sub-circuit 20 is connected to the first signal input terminal IN1, the signal at the first signal input terminal IN1 is provided by a second signal output terminal OUT2 of a previous stage of shift register unit, and a duty ratio of the clock signal at the second clock signal terminal CLK2 may be controlled to control a high level signal or a low level signal at the first signal input terminal IN1. In this way, in a turn-on phase of the first output sub-circuit 30 and the second output sub-circuit 40, a voltage difference between the first signal input terminal IN1 and the pull-up node PU may be reduced by adjusting the signal at the first signal input terminal IN1, which may improve the problem of decrease in potential at the pull-up node PU due to the electrical leakage of the second input sub-circuit 20, thereby improving the stability of the output signal of the shift register unit.

The phrase "A connected to B" as described above may refers to "A directly connected to B" or "A indirectly connected to B". For example, in some embodiments, the first input sub-circuit 10 may be directly connected to the first signal input terminal IN1 and the pull-up node PU. In some embodiments, the second input sub-circuit 20 may be directly connected to the second signal input terminal IN2, the first signal input terminal IN1, and the pull-up node PU. In some embodiments, the first output sub-circuit 30 may be directly connected to the pull-up node PU, the first clock signal terminal CLK1, and the first signal output terminal OUT1. In some embodiments, the second output sub-circuit 40 may be directly connected to the pull-up node PU, the second clock signal terminal CLK2, and the second signal output terminal OUT2.

Figure 4:
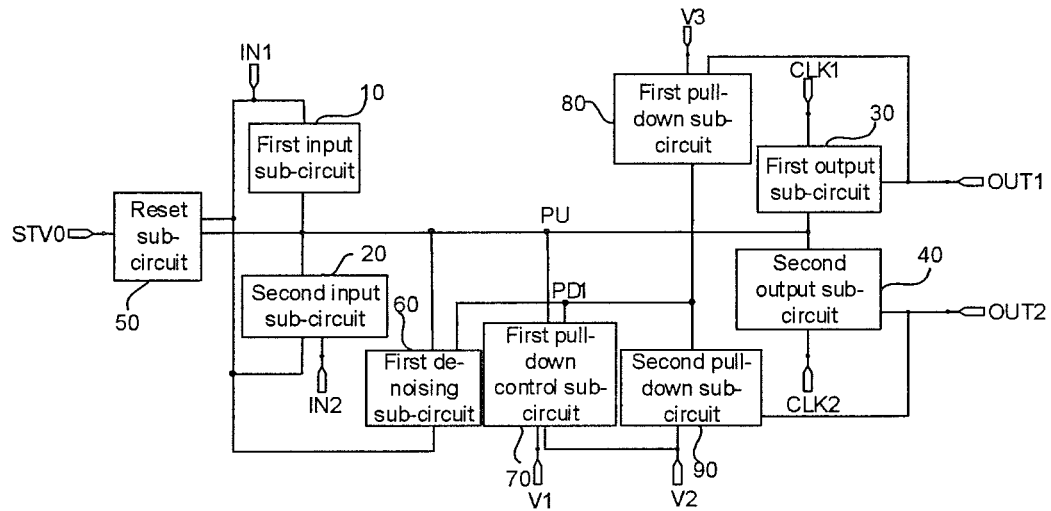
FIG. 4 is a schematic structural diagram of a shift register unit according to another embodiment of the present disclosure.

In some embodiments, as shown in FIG. 4, the shift register unit further comprises a reset sub-circuit 50. The reset sub-circuit 50 is connected to a reset signal terminal STV0, the first signal input terminal IN1, and the pull-up node PU, and may transmit the signal at the first signal input terminal IN1 to the pull-up node PU under control of the reset signal terminal STV0. Since the reset sub-circuit 50 is also connected to the pull-up node PU, when the reset sub-circuit 50 is connected to the first signal input terminal IN1, it may improve the problem of decrease in potential at the pull-up node PU due to the electrical leakage of the reset sub-circuit 50.

In some embodiments, as shown in FIG. 4, the shift register unit further comprises a first de-noising sub-circuit 60. The first de-noising sub-circuit 60 is connected to a first pull-down node PD1, the pull-up node PU, and the first signal input terminal IN1, and may transmit the signal at the first signal input terminal IN1 to the pull-up node PU under control of the first pull-down node PD1. Since the first de-noising sub-circuit 60 is also connected to the pull-up node PU, when the first de-noising sub-circuit 60 is connected to the first signal input terminal IN1, it may improve the problem of decrease in potential at the pull-up node PU due to the electrical leakage of the first de-noising sub-circuit 60.

In some embodiments, as shown in FIG. 4, the shift register unit further comprises a first pull-down control sub-circuit 70. The first pull-down control sub-circuit 70 is connected to the pull-up node PU, a first voltage terminal V1, a second voltage terminal V2, and the first pull-down node PD1, and may control a level at the first pull-down node PD1.

In some embodiments, as shown in FIG. 4, the shift register unit further comprises a first pull-down sub-circuit 80 and a second pull-down sub-circuit 90. The first pull-down sub-circuit 80 is connected to the first pull-down node PD1, the first signal output terminal OUT1, and a third voltage terminal V3, and may transmit a signal at the third voltage terminal V3 to the first signal output terminal OUT1 under control of the first pull-down node PD1. The second pull-down sub-circuit 90 is connected to the first pull-down node PD1, a second signal output terminal OUT2, and the second voltage terminal V2, and may transmit a signal at the second voltage terminal V2 to the second signal output terminal OUT2 under control of the first pull-down node PD1.

The shift register unit according to the present disclosure may be applied to, for example, an alternating current model, the signal input at the first voltage terminal V1 may be a high frequency signal, the signal at the first voltage terminal V1 has an opposite polarity to those of the signals at the first clock signal terminal CLK1 and the second clock signal terminal CLK2, which results in a small number of transistors in the shift register unit.

Figure 5:
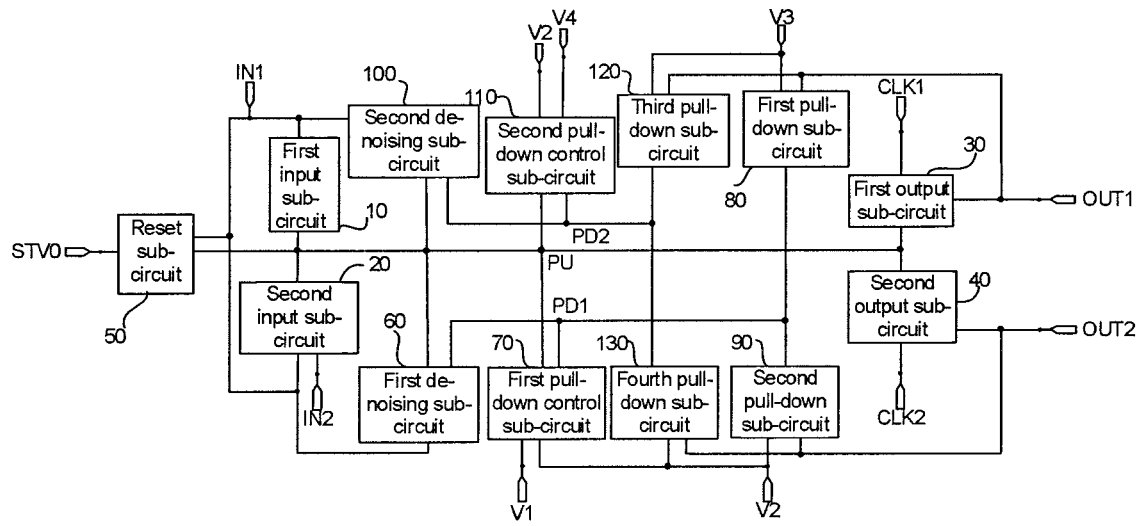
FIG. 5 is a schematic structural diagram of a shift register unit according to yet another embodiment of the present disclosure.

In some embodiments, as shown in FIG. 5, the shift register unit comprises a second de-noising sub-circuit 100. The second de-noising sub-circuit 100 is connected to a second pull-down node PD2, the pull-up node PU, and the first signal input terminal IN1, and may transmit the signal at the first signal input terminal IN1 to the pull-up node PU under control of the second pull-down node PD2. Since the second de-noising sub-circuit 100 is also connected to the pull-up node PU, when the second de-noising sub-circuit 100 is connected to the first signal input terminal IN1, it may improve the problem of decrease in potential at the pull-up node PU due to the electrical leakage of the second de-noising sub-circuit 100.

In some embodiments, as shown in FIG. 5, the shift register unit further comprises a second pull-down control sub-circuit 110. The second pull-down control sub-circuit 110 is connected to the pull-up node PU, a fourth voltage terminal V4, the second voltage terminal V2, and the second pull-down node PD2, and may control a level at the second pull-down node PD2.

In some embodiments, as shown in FIG. 5, the shift register unit further comprises a third pull-down sub-circuit 120 and a fourth pull-down sub-circuit 130. The third pull-down sub-circuit 120 is connected to the second pull-down node PD2, the first signal output terminal OUT1, and the third voltage terminal V3, and may transmit the signal at the third voltage terminal V3 to the first signal output terminal OUT1 under control of the second pull-down node PD2. The fourth pull-down sub-circuit 130 is connected to the second pull-down node PD2, the second signal output terminal OUT2, and the second voltage terminal V2, and may transmit the signal at the second voltage terminal V2 to the second signal output terminal OUT2 under control of the second pull-down node PD2.

The shift register unit according to the present disclosure may be applied to a direct current model, and the first voltage terminal V1 and the fourth voltage terminal V4 are at a high level for a first period and are at a low level for a second period (for example, change periodically). In this way, normal display may be ensured as long as one of the first voltage terminal V1 and the fourth voltage terminal V4 is maintained at a high level, which may reduce a duty cycle of a gate bias voltage in each of transistors in the first pull-down control sub-circuit 70 and the second pull-down control sub-circuit 110, thereby reducing a drift in a threshold voltage.

Before the shift register unit outputs a gate scanning signal, the reset signal terminal STV0 inputs a turn-on signal, to control the reset sub-circuit 50 to transmit a second signal at the first signal input terminal IN1 to the pull-up node PU to reset the pull-up node PU.

The first input sub-circuit 10 transmits the signal at the first signal input terminal IN1 to the pull-up node PU under control of the first signal at the first signal input terminal IN1 to charge the pull-up node PU. After the pull-up node PU is charged, the first output sub-circuit 30 may output the clock signal at the first clock signal terminal CLK1 to the first signal output terminal OUT1 under control of the pull-up node PU, so that the first signal output terminal OUT1 may output a gate scanning signal to a gate line connected to the first signal output terminal OUT1 in an output phase. The second output sub-circuit 40 may output the clock signal at the second clock signal terminal CLK2 to the second signal output terminal OUT2 under control of the pull-up node PU, so that the a next stage of shift register unit is turned on. Here, the second input sub-circuit 20, the reset sub-circuit 50, the first de-noising sub-circuit 60, and the second de-noising sub-circuit 100 are connected to the first signal input terminal IN1 to prevent electrical leakage at the pull-up node PU.

The second input sub-circuit 20 transmits the second signal at the first signal input terminal IN1 to the pull-up node PU under control of the second signal input terminal IN2 to control the first output sub-circuit 30 and the second output sub-circuit 40 to be turned off.

In some embodiments, the potential at the first pull-down node PD1 may be controlled by the first pull-down control sub-circuit 70, so that the first pull-down sub-circuit 80 pulls down the potential at the first signal output terminal OUT1 to a potential at the third voltage terminal V3 (for example, a first reference level VGL) under control of the first pull-down node PD1, and thereby an output signal at the first reference level is output at the first signal output terminal OUT1. The second pull-down sub-circuit 90 pulls down the potential at the second signal output terminal OUT2 to the potential at the second voltage terminal V2 (for example, a second reference level LVGL) under control of the first pull-down node PD1, so that an output signal at the second reference level is output at the second signal output terminal OUT2. The first de-noising sub-circuit 60 transmits the potential at the first signal input terminal IN1 to the pull-up node PU under control of the first pull-down node PD1, to pull down the potential at the pull-up node PU to the potential at the first signal input terminal IN1 to de-noise the pull-up node PU.

In some other embodiments, the second pull-down control sub-circuit 110 may control the potential at the second pull-down node PD2, so that the third pull-down sub-circuit 120 pulls down the potential at the first signal output terminal OUT1 to the potential at the third voltage terminal V3 under control of the second pull-down node PD2, and thereby the output signal at the first reference level is output at the first signal output terminal OUT1. The fourth pull-down sub-circuit 130 pulls down the potential at the second signal output terminal OUT2 to the potential at the second voltage terminal V2 under control of the second pull-down node PD2, so that the output signal at the second reference level is output at the second signal output terminal OUT2.

The second de-noising sub-circuit 100 transmits the potential at the first signal input terminal IN1 to the pull-up node PU under control of the second pull-down node PD2, to pull down the potential at the pull-up node PU to the potential at the first signal input terminal IN1 to de-noise the pull-up node PU.

Figure 6:
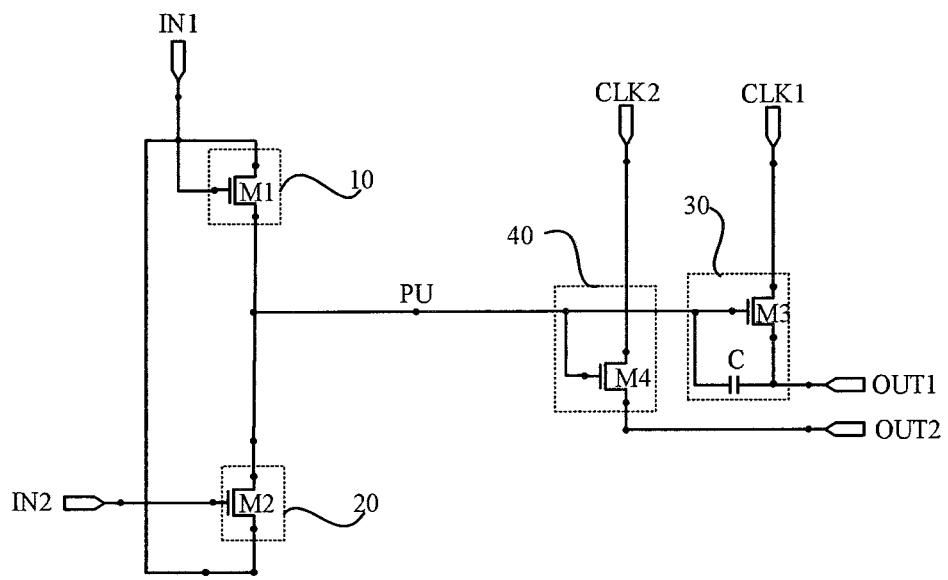
FIG. 6 is an exemplary circuit diagram of the shift register unit of FIG. 3.

FIG. 6 is an exemplary circuit diagram of the shift register unit of FIG. 3.

As shown in FIG. 6, the first input sub-circuit 10 comprises a first transistor M1 having a gate connected to the first signal input terminal IN1, a first electrode connected to the first signal input terminal IN1, and a second electrode connected to the pull-up node PU.

The second input sub-circuit 20 comprises a second transistor M2 having a gate connected to the second signal input terminal IN2, a first electrode connected to the pull-up node PU, and a second electrode connected to the first signal input terminal IN1.

The first output sub-circuit 30 comprises a third transistor M3 and a storage capacitor C. The third transistor M3 has a gate connected to the pull-up node PU, a first electrode connected to the first clock signal terminal CLK1, and a second electrode connected to the first signal output terminal OUT1; and the storage capacitor C has a first terminal connected to the pull-up node PU and the gate of the third transistor M3, and a second terminal connected to the second electrode of the third transistor M3 and the first signal output terminal OUT1.

The second output sub-circuit 40 comprises a fourth transistor M4 having a gate connected to the pull-up node PU and the first terminal of the storage capacitor C, a first electrode connected to the second clock signal terminal CLK2, and a second electrode connected to the second signal output terminal OUT2.

The second electrode of the second transistor M2 is connected to the first signal input terminal IN1. When the pull-up node PU is at a high level, the first signal input terminal IN1 is also at a high level, which may reduce a voltage difference between the first electrode and the second electrode of the second transistor M2, so that the potential at the pull-up node PU may be maintained at a high level, to reduce the electrical leakage at the pull-up node PU.

Figure 7:
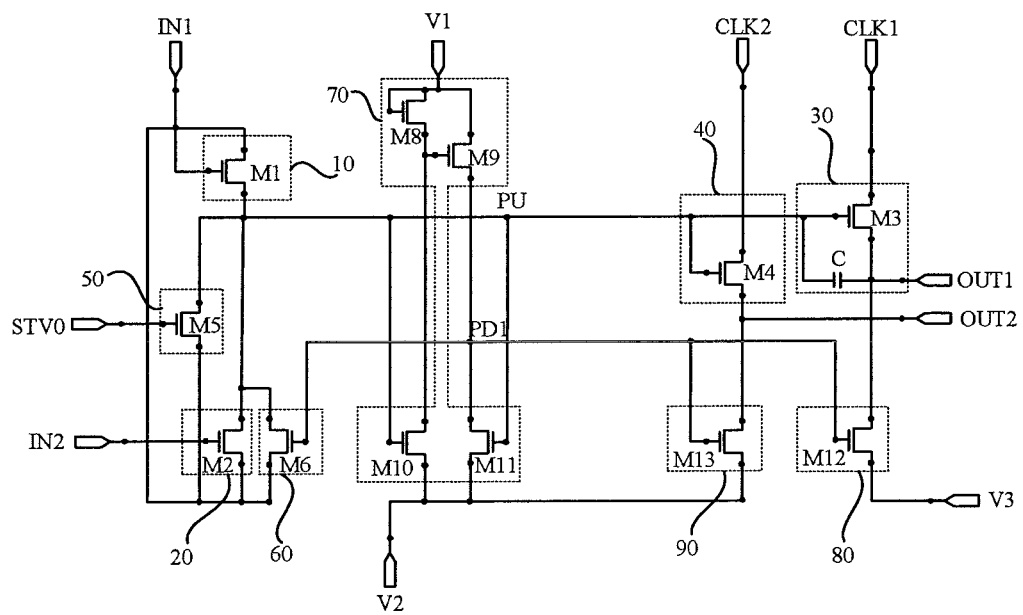
FIG. 7 is an exemplary circuit diagram of the shift register unit of FIG. 4.

FIG. 7 is an exemplary circuit diagram of the shift register unit of FIG. 4.

As shown in FIG. 7, the shift register unit comprises a first input sub-circuit 10, a second input sub-circuit 20, a first output sub-circuit 30, a second output sub-circuit 40, a reset sub-circuit 50, a first de-noising sub-circuit 60, a first pull-down control sub-circuit 70 and a first pull-down sub-circuit 80.

The reset sub-circuit 50 comprises a fifth transistor M5. The fifth transistor M5 has a gate connected to the reset signal terminal STV0, a first electrode connected to the pull-up node PU, and a second electrode connected to the first signal input terminal IN1. The second electrode of the fifth transistor M5 is connected to the first signal input terminal IN1. When the pull-up node PU is at a high level, the first signal input terminal IN1 is also at a high level, which may reduce a voltage difference between the first electrode and the second electrode of the fifth transistor M5, so that the potential at the pull-up node PU may be maintained at a high level, to reduce the electrical leakage at the pull-up node PU.

The first input sub-circuit 10 comprises a first transistor M1 having a gate connected to the first signal input terminal IN1, a first electrode connected to the first signal input terminal IN1, and a second electrode connected to the pull-up node PU.

The second input sub-circuit 20 comprises a second transistor M2 having a gate connected to the second signal input terminal IN2, a first electrode connected to the pull-up node PU, and a second electrode connected to the first signal input terminal IN1.

The first output sub-circuit 30 comprises a third transistor M3 and a storage capacitor C. The third transistor M3 has a gate connected to the pull-up node PU, a first electrode connected to the first clock signal terminal CLK1, and a second electrode connected to the first signal output terminal OUT1; and the storage capacitor C has a first terminal connected to the pull-up node PU and the gate of the third transistor M3, and a second terminal connected to the second electrode of the third transistor M3 and the first signal output terminal OUT1.

The second output sub-circuit 40 comprises a fourth transistor M4 having a gate connected to the pull-up node PU and the first terminal of the storage capacitor C, a first electrode connected to the second clock signal terminal CLK2, and a second electrode connected to the second signal output terminal OUT2.

The reset sub-circuit 50 comprises a fifth transistor M5 having a gate connected to the reset signal terminal STV0, a first electrode connected to the pull-up node PU, and a second electrode connected to the first signal input terminal IN1.

The first de-noising sub-circuit 60 comprises a sixth transistor M6 having a gate connected to the first pull-down node PD1, a first electrode connected to the pull-up node PU, and a second electrode connected to the first signal input terminal IN1.

The first pull-down control sub-circuit 70 comprises an eighth transistor M8, a ninth transistor M9, a tenth transistor M10, and an eleventh transistor M11.

The eighth transistor M8 has a gate connected to the first voltage terminal V1, a first electrode connected to the first voltage terminal V1, and a second electrode connected to a gate of the ninth transistor M9 and a first electrode of the tenth transistor M10.

The ninth transistor M9 has the gate also connected to the first electrode of the tenth transistor M10, a first electrode connected to the first voltage terminal V1, and a second electrode connected to the first pull-down node PD1.

The tenth transistor M10 has a gate connected to the pull-up node PU, and a second electrode connected to the second voltage terminal V2.

The eleventh transistor M11 has a gate connected to the pull-up node PU, a first electrode connected to the first pull-down node PD1, and a second electrode connected to the second voltage terminal V2.

The first pull-down sub-circuit 80 comprises a twelfth transistor M12, and the second pull-down sub-circuit 90 comprises a thirteenth transistor M13.

The twelfth transistor M12 has a gate connected to the first pull-down node PD1, a first electrode connected to the first signal output terminal OUT1, and a second electrode connected to the third voltage terminal V3.

The thirteenth transistor M13 has a gate connected to the first pull-down node PD1, a first electrode connected to the second signal output terminal OUT2, and a second electrode connected to the second voltage terminal V2.

Figure 8:
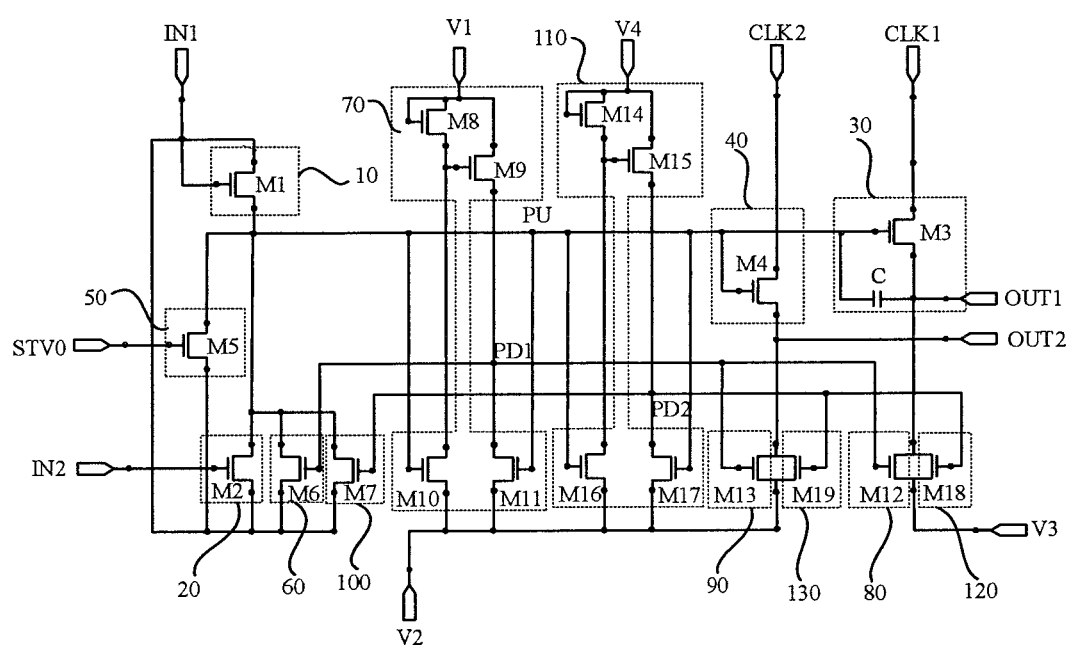
FIG. 8 is an exemplary circuit diagram of the shift register unit of FIG. 5.

FIG. 8 is an exemplary circuit diagram of the shift register unit of FIG. 5.

As shown in FIG. 8, the shift register unit comprises a first input sub-circuit 10, a second input sub-circuit 20, a first output sub-circuit 30, a second output sub-circuit 40, a reset sub-circuit 50, a first de-noising sub-circuit 60, a first pull-down control sub-circuit 70, a first pull-down sub-circuit 80, a second pull-down sub-circuit 90, a second de-noising sub-circuit 100, a second pull-down control sub-circuit 110, and a third pull-down sub-circuit 120.

The first input sub-circuit 10 comprises a first transistor M1 having a gate connected to the first signal input terminal IN1, a first electrode connected to the first signal input terminal IN1, and a second electrode connected to the pull-up node PU.

The second input sub-circuit 20 comprises a second transistor M2 having a gate connected to the second signal input terminal IN2, a first electrode connected to the pull-up node PU, and a second electrode connected to the first signal input terminal IN1.

The first output sub-circuit 30 comprises a third transistor M3 and a storage capacitor C. The third transistor M3 has a gate connected to the pull-up node PU, a first electrode connected to the first clock signal terminal CLK1, and a second electrode connected to the first signal output terminal OUT1; and the storage capacitor C has a first terminal connected to the pull-up node PU and the gate of the third transistor M3, and a second terminal connected to the second electrode of the third transistor M3 and the first signal output terminal OUT1.

The second output sub-circuit 40 comprises a fourth transistor M4 having a gate connected to the pull-up node PU and the first terminal of the storage capacitor C, a first electrode connected to the second clock signal terminal CLK2, and a second electrode connected to the second signal output terminal OUT2.

The reset sub-circuit 50 comprises a fifth transistor M5 having a gate connected to the reset signal terminal STV0, a first electrode connected to the pull-up node PU, and a second electrode connected to the first signal input terminal IN1.

The first de-noising sub-circuit 60 comprises a sixth transistor M6 having a gate connected to the first pull-down node PD1, a first electrode connected to the pull-up node PU, and a second electrode connected to the first signal input terminal IN1.

The second de-noising sub-circuit 100 comprises a seventh transistor M7 having a gate connected to the second pull-down node PD2, a first electrode connected to the pull-up node PU, and a second electrode connected to the first signal input terminal IN1.

The first pull-down control sub-circuit 70 comprises an eighth transistor M8, a ninth transistor M9, a tenth transistor M10, and an eleventh transistor M11. The eighth transistor M8 has a gate connected to the first voltage terminal V1, a first electrode connected to the first voltage terminal V1, and a second electrode connected to a gate of the ninth transistor M9 and a first electrode of the tenth transistor M10. The ninth transistor M9 has the gate also connected to the first electrode of the tenth transistor M10, a first electrode connected to the first voltage terminal V1, and a second electrode connected to the first pull-down node PD1. The tenth transistor M10 has a gate connected to the pull-up node PU, and a second electrode connected to the second voltage terminal V2. The eleventh transistor M11 has a gate connected to the pull-up node PU, a first electrode connected to the first pull-down node PD1, and a second electrode connected to the second voltage terminal V2. The second pull-down control sub-circuit 110 comprises a fourteenth transistor M14, a fifteenth transistor M15, a sixteenth transistor M16, and a seventeenth transistor M17. The fourteenth transistor M14 has a gate connected to the fourth voltage terminal V4, a first electrode connected to the fourth voltage terminal V4, and a second electrode connected to a gate of the fifteenth transistor M15 and a first electrode of the sixteenth transistor M16. The fifteenth transistor M15 has the gate also connected to the first electrode of the sixteenth transistor M16, a first electrode connected to the fourth voltage terminal V4, and a second electrode connected to the second pull-down node PD2. The sixteenth transistor M16 has a gate connected to the pull-up node PU, and a second electrode connected to the second voltage terminal V2. The seventeenth transistor M17 has a gate connected to the pull-up node PU, a first electrode connected to the second pull-down node PD2, and a second electrode connected to the second voltage terminal V2.

The first pull-down sub-circuit 80 comprises a twelfth transistor M12, and the second pull-down sub-circuit 90 comprises a thirteenth transistor M13. The twelfth transistor M12 has a gate connected to the first pull-down node PD1, a first electrode connected to the first signal output terminal OUT1, and a second electrode connected to the third voltage terminal V3. The thirteenth transistor M13 has a gate connected to the first pull-down node PD1, a first electrode connected to the second signal output terminal OUT2, and a second electrode connected to the second voltage terminal V2.

The third pull-down sub-circuit 120 comprises an eighteenth transistor M18, and the fourth pull-down sub-circuit 130 comprises a nineteenth transistor M19. The eighteenth transistor M18 has a gate connected to the second pull-down node PD2, a first electrode connected to the first signal output terminal OUT1, and a second electrode connected to the third voltage terminal V3. The nineteenth transistor M19 has a gate connected to the second pull-down node PD2, a first electrode connected to the second signal output terminal OUT2, and a second electrode connected to the second voltage terminal V2.

It should be illustrated that the above transistors may be N-type transistors or P-type transistors; and may be enhancement transistors or depletion transistors. A first electrode of each of the transistors may be a source, and a second electrode of the transistor may be a drain, or the first electrode of the transistor may be a drain, and the second electrode of the transistor may be a source, which is not limited in the present disclosure.

In addition, the second voltage terminal V2 and the third voltage terminal V3 may be the same voltage terminal or different voltage terminals.

The phrase "A connected to B" as described above may refers to "A directly connected to B" or "A indirectly connected to B". For example, in some embodiments, the gate of the first transistor T1 may be directly connected to the first signal input terminal IN1, the first electrode of the first transistor T1 may be directly connected to the first signal input terminal IN1, and the second electrode of the first transistor T1 may be directly connected to the pull-up node PU. In some embodiments, the gate of the second transistor T2 may be directly connected to the second signal input terminal IN2, the first electrode of the second transistor T2 may be directly connected to the pull-up node PU, and the second electrode of the second transistor T2 may be directly connected to the first signal input terminal IN1. In some embodiments, the gate of the third transistor T3 may be directly connected to the pull-up node PU, the first electrode of the third transistor T3 may be directly connected to the first clock signal terminal CLK1, and the second electrode of the third transistor T3 may be directly connected to the first signal output terminal OUT1. In some embodiments, the first terminal of the storage capacitor C may be directly connected to the pull-up node PU, and the second terminal of the storage capacitor C may be directly connected to the first signal output terminal OUT1. In some embodiments, the gate of the fourth transistor T4 may be directly connected to the pull-up node PU, the first electrode of the fourth transistor T4 may be directly connected to the second clock signal terminal CLK2, and the second electrode of the fourth transistor T4 may be directly connected to the second signal output terminal OUT2.

Figure 9:
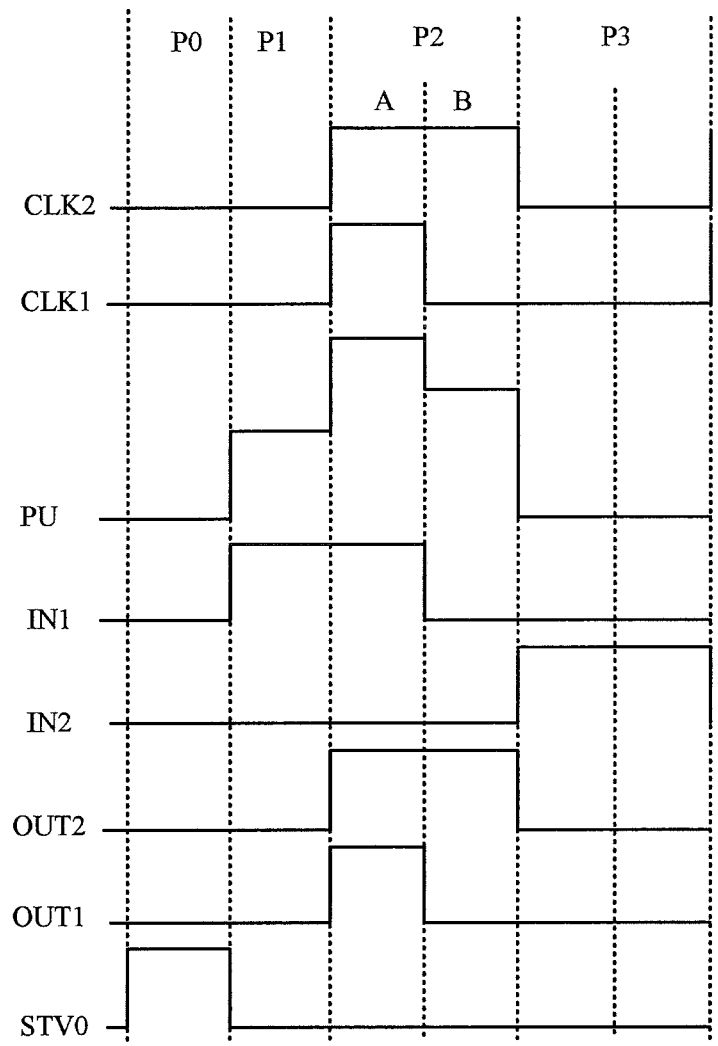
FIG. 9 is a signal timing diagram of the shift register unit of FIG. 8.

Hereinafter, operations of the shift register unit shown in FIG. 8 in different phases (P0 to P3) will be described in detail by taking the above transistors being N-type transistors as an example in conjunction with a signal timing diagram shown in FIG. 9. The present embodiment is described by taking a first reference signal being applied to the second voltage terminal V2, a second reference signal being applied to the third voltage terminal V3, a first power signal being applied to the first voltage terminal V1, and a second power signal being applied to the fourth voltage terminal V4 as an example. The first reference signal may have a constant first reference voltage, the second reference signal may have a constant second reference voltage, and the first power signal and the second power signal may be at a constant high level alternatively, that is, the first power signal is at a high level and the second power signal is at a low level for a first period, and the first power signal is at a low level and the second power signal is at a high level for a second period.

In a reset phase P0, STV0=1, and other signals are 0; where "0" represents a low level and "1" represents a high level.

The fifth transistor M5 transmits a low level signal at the first signal input terminal IN1 to the pull-up node PU under control of the reset signal terminal STV0 to reset the pull-up node PU.

In an input phase P1, IN1=1, IN2=0, STV0=0, CLK1=0, and CLK2=0.

The first transistor M1 is turned on under control of the high level at the first signal input terminal IN1, to transmit the high level at the first signal input terminal IN1 to the pull-up node PU to charge the storage capacitor C. Under control of the high potential at the pull-up node PU, the third transistor M3 is turned on to transmit the low level at the first clock signal terminal CLK1 to the first signal output terminal OUT1; and the fourth transistor M4 is turned on to transmit the low level at the second clock signal terminal CLK2 to the second signal output terminal OUT2.

In a case where V1=1 and V4=0, the eighth transistor, the tenth transistor M10, and the eleventh transistor M11 are turned on under control of the pull-up node PU. The tenth transistor M10 is turned on to transmit the low level at the second voltage terminal V2 to the gate of the ninth transistor M9. The eighth transistor M8 is turned on to transmit the high level at the first voltage terminal V1 to the gate of the ninth transistor M9. However, since an aspect ratio of a channel of the tenth transistor M10 is greater than that of the eighth transistor M8, under action of voltage division of the eighth transistor M8 and the tenth transistor M10, a gate voltage of the ninth transistor M9 is insufficient to completely turn on the ninth transistor M9. The eleventh transistor M11 is turned on under control of the pull-up node PU, to transmit the low level at the second voltage terminal V2 to the first pull-down node PD1, and the ninth transistor M9 transmits the high level at the first voltage terminal V1 to the first pull-down node PD1. However, since an aspect ratio of the eleventh transistor M11 is greater than that of the ninth transistor M9, and the ninth transistor M9 is not completely turned on, the potential at the first pull-down node PD1 is pulled down to a low level.

The fourteenth transistor M14 is turned off under control of the low level at the fourth voltage terminal V4, and the sixteenth transistor M16 is turned on under control of the pull-up node PU, to transmit the low level at the second voltage terminal V2 to the gate of the fifteenth transistor M15, to control the fifteenth transistor M15 to be turned off. The seventeenth transistor M17 transmits the low level at the second voltage terminal V2 to the second pull-down node PD2 under control of the pull-up node PU, to pull down the potential at the second pull-down node PD2 to a low level.

In this case, the sixth transistor M6, the seventh transistor M7, the twelfth transistor M12, the thirteenth transistor M13, the eighteenth transistor M18, and the nineteenth transistor M19 are all in a turn-off state, and the fifth transistor M5 is turned off under control of the low level at the reset signal terminal STV0.

In a case where V1=0 and V4=1, the sixteenth transistor M16 is turned on under control of the pull-up node PU, to transmit the low level at the second voltage terminal V2 to the gate of the fifteenth transistor M15. The fourteenth transistor M14 is turned on under control of the high level at the fourth voltage terminal V4, to transmit the high level at the fourth voltage terminal V4 to the gate of the fifteenth transistor M15. However, since an aspect ratio of a channel of the sixteenth transistor M16 is greater than that of the fourteenth transistor M14, under action of voltage division of the fourteenth transistor M14 and the sixteenth transistor M16, a gate voltage of the fifteenth transistor M15 is insufficient to completely turn on the fifteenth transistor M15. The seventeenth transistor M17 is turned on under control of the pull-up node PU, to transmit the low level at the second voltage terminal V2 to the second pull-down node PD2, and the fifteenth transistor M15 transmits the high level at the fourth voltage terminal V4 to the second pull-down node PD2. However, since an aspect ratio of the seventeenth transistor M17 is greater than that of the fifteenth transistor M15, and the fifteenth transistor M15 is not completely turned on, the potential at the second pull-down node PD2 may be pulled down to a low level.

The eighth transistor M8 is turned off under control of the low level at the first voltage terminal V1, and the tenth transistor M10 is turned on under control of the pull-up node PU, to transmit the low level at the second voltage terminal V2 to the gate of the ninth transistor M9 to turn off the ninth transistor M9. The eleventh transistor M11 transmits the low level at the second voltage terminal V2 to the first pull-down node PD1 under control of the pull-up node PU, to pull down the potential at the first pull-down node PD1 to a low level.

In this case, the sixth transistor M6, the seventh transistor M7, the twelfth transistor M12, the thirteenth transistor M13, the eighteenth transistor M18, and the nineteenth transistor M19 are all in a turn-off state, and the fifth transistor M5 is turned off under control of the low level at the reset signal terminal STV0.

In summary, in the input phase P1, the first signal output terminal OUT1 outputs a first output signal at a low level, and the second signal output terminal OUT2 outputs a second output signal at a low level.

The output phase P2 comprises a first output phase A and a second output phase B.

In the first output phase A, IN1=1, IN2=0, STV0=0, CLK1=1, and CLK2=1.

The first transistor M1 transmits the high level at the first signal input terminal IN1 to the pull-up node PU, and the storage capacitor C may charge the pull-up node PU, so that the third transistor M3 and the fourth transistor M4 are maintained in a turn-on state. In this case, the high level at the first clock signal terminal CLK1 is output to the first signal output terminal OUT1 through the third transistor M3, and the high level at the second clock signal terminal CLK2 is output to the second signal output terminal OUT2 through the fourth transistor M4. In addition, under action of the bootstrapping of the storage capacitor C, the potential at the pull-up node PU further rises (the potential at the first signal output terminal OUT1 changes from a low level to a high level, and in order to maintain a voltage across the storage capacitor C to be unchanged, the potential at the pull-up node PU further rises under action of the storage capacitor C), to maintain the third transistor M3 and the fourth transistor M4 to be in a turn-on state. Thereby, the high level at the first clock signal terminal CLK1 may be output as a gate scanning signal to a gate line connected to the first signal output terminal OUT1, and the high level at the second clock signal terminal CLK2 may be transmitted as a turn-on signal to a next stage of shift register unit connected to the second signal output terminal OUT2.

In a second output phase B, IN1=0, IN2=0, STV0=0, CLK1=0, and CLK2=1.

The fifth transistor M5 is turned off under control of the low level at the reset signal terminal STV0, and the second transistor M2 is turned off under control of the low level at the second signal input terminal IN2. Thereby, a low level signal may not be transmitted to the pull-up node PU, and the potential at the pull-up node PU is maintained at a high level. However, a specific potential is related to a coupling condition of the first clock signal terminal CLK1 and the second clock signal terminal CLK2. Under control of the pull-up node PU, the third transistor M3 transmits the low level signal at the first clock signal terminal CLK1 to the first signal output terminal OUT1, to input a scanning turn-off signal to the gate line. Under control of the pull-up node PU, the fourth transistor M4 transmits the high level at the second clock signal terminal CLK2 to the second signal output terminal OUT2, to continue to input a high level signal to a first signal input terminal IN1 of a next stage of shift register unit.

In summary, in the output phase P2, the first output signal output at the first signal output terminal OUT1 is at a high level in the first output phase A, and is at a low level in the second output phase B, and the second output signal output at the second signal output terminal OUT2 is always at a high level in the entire output phase P2.

In a pull-down phase P3, IN1=0, IN2=1, STV0=0, CLK1=0, and CLK2=0.

The second transistor M2 is turned on under control of the high level at the second signal input terminal IN2, to transmit the low level at the first signal input terminal IN1 to the pull-up node PU, to pull down the potential at the pull-up node PU to a low level.

In a case where V1=1 and V4=0, the tenth transistor M10 and the eleventh transistor M11 are turned off under control of the low potential at the pull-up node PU. The eighth transistor M8 is turned on under control of the high potential at the first voltage terminal V1, to transmit the high potential at the first voltage terminal V1 to the gate of the ninth transistor M9, to control the ninth transistor M9 to be turned on. Thereby, the high potential at the first voltage terminal V1 is transmitted to the first pull-down node PD1, to pull up the potential at the first pull-down node PD1 to a high level.

Under control of the first pull-down node PD1, the sixth transistor M6 is turned on, to transmit the low level at the first signal input terminal IN1 to the pull-up node PU, to de-noise the pull-up node PU; the twelfth transistor M12 is turned on, to transmit the low level at the third voltage terminal V3 to the first signal output terminal OUT1; and the thirteenth transistor M13 is turned on, to transmit the low level at the second voltage terminal V2 to the second signal output terminal OUT2.

The sixteenth transistor M16 and the seventeenth transistor M17 are both turned off under control of the low potential at the pull-up node PU, the fourteenth transistor M14 and the fifteenth transistor M15 are both turned off under control of the low potential at the fourth voltage terminal V4, and the potential at the second pull-down node PD2 is maintained at a low level to control the seventh transistor M7, the eighteenth transistor M18, and the nineteenth transistor M19 to be turned off. The fifth transistor M5 is turned off under control of the reset signal terminal STV0.

In a case where V1=0 and V4=1, the sixteenth transistor M16 and the seventeenth transistor M17 are turned off under control of the low potential at the pull-up node PU. The fourteenth transistor M14 is turned on under control of the high potential at the fourth voltage terminal V4, to transmit the high potential at the fourth voltage terminal V4 to the gate of the fifteenth transistor M15 to control the fifteenth transistor M15 to be turned on. Thereby, the high potential at the fourth voltage terminal V4 is transmitted to the second pull-down node PD2, to pull up the potential at the second pull-down node PD2 to a high level.

The seventh transistor M7, the eighteenth transistor M18, and the nineteenth transistor M19 are turned on under action of the high level at the second pull-down node PD2. The seventh transistor M7 is turned on to transmit the low level at the first signal input terminal IN1 to the pull-up node PU, to de-noise the pull-up node PU. The eighteenth transistor M18 is turned on to transmit the low level at the third voltage terminal V3 to the first signal output terminal OUT1. The nineteenth transistor M19 is turned on to transmit the low level at the second voltage terminal V2 to the second signal output terminal OUT2.

The tenth transistor M10 and the eleventh transistor M11 are both turned off under control of the low potential at the pull-up node PU. The eighth transistor M8 and the ninth transistor M9 are both turned off under control of the low potential at the first voltage terminal V1, and the potential at the first pull-down node PD1 is maintained at a low level to control the sixth transistor M6, the twelfth transistor M12 and the thirteenth transistor M13 to be turned off. The fifth transistor M5 is turned off under control of the reset signal terminal STV0.

In summary, in the pull-down phase P3, the first signal output terminal OUT1 outputs a first output signal at a low level, and the second signal output terminal OUT2 outputs a second output signal at a low level.

It should be illustrated that the turn-on and turn-off processes of the transistors in the above embodiments are described by taking all the transistors being N-type transistors as an example. When all the transistors are P-type transistors, control signals in FIG. 9 need to be reversed, and turn-on and turn-off processes of the transistors in the respective circuits in the shift register unit are the same as above, and will not be described in detail here.

Figure 10A:
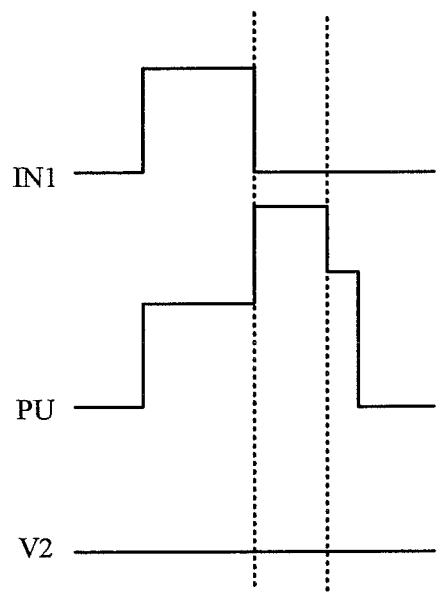
FIG. 10a is a signal timing diagram of the shift register unit of FIG. 1.
Figure 10B:
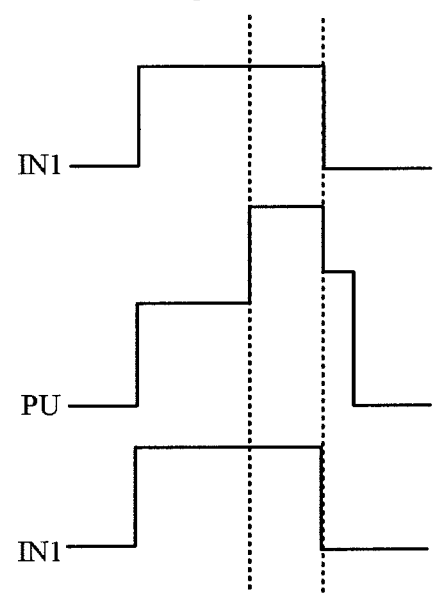
FIG. 10b is a signal timing diagram of the shift register unit of FIG. 6.
Figure 11:
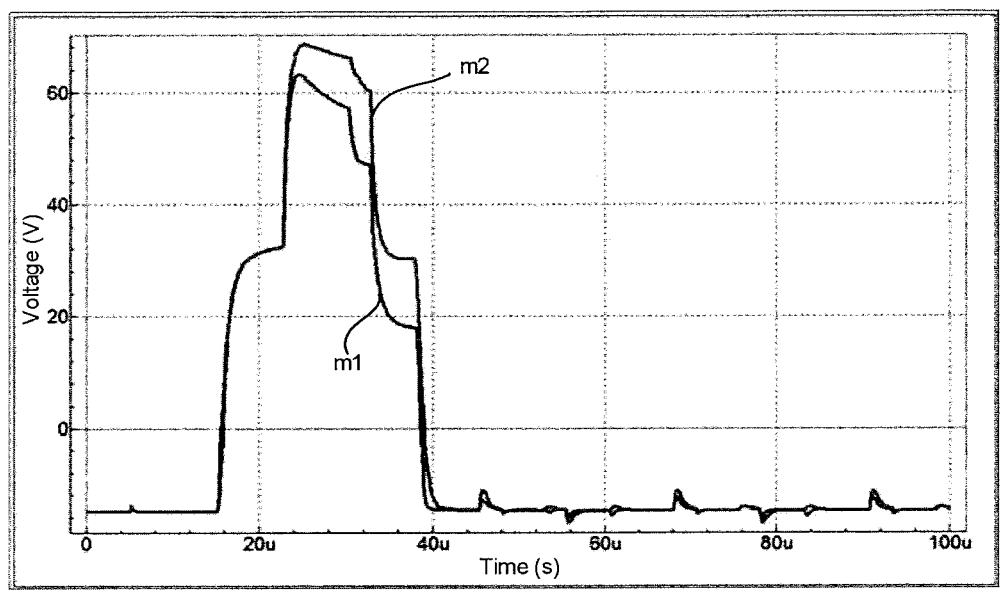
FIG. 11 is a comparison diagram of signal waveforms at pull-up nodes in the shift register unit of FIG. 1 and the shift register unit of FIG. 6.

FIG. 10a is a signal timing diagram of the shift register unit of FIG. 1. FIG. 10b is a signal timing diagram of the shift register unit of FIG. 6. FIG. 11 is a comparison diagram of signal waveforms at pull-up nodes in the shift register unit shown in FIG. 1 and the shift register unit shown in FIG. 6.

It may be seen by comparing FIGS. 10a and 10b that, the duty ratio of the clock signal output at the second clock signal terminal CLK2 is increased, so that the high level signal at the first signal input terminal IN1 overlaps the high level signal at the pull-up node PU (as shown by a portion between two dashed lines in the figures). In this way, voltages Vds of the second transistor M2, the fifth transistor M5, the sixth transistor M6, and the seventh transistor M7 related to the discharging at the pull-up node PU are generated by the high levels at the pull-up node PU and the first signal input terminal IN1. Compared with a case where the voltages Vds of the second transistor M2, the fifth transistor M5, the sixth transistor M6, and the seventh transistor M7 are generated by the low levels at the pull-up node PU and the second voltage terminal IN2, Vds of the above four transistors may be significantly reduced.

As shown in FIG. 11, a curve m1 represents a signal waveform at the pull-up node PU of the shift register unit shown in FIG. 1, and a curve m2 represents a signal waveform at the pull-up node PU of the shift register unit provided in FIG. 6. It may be seen that, compared with the shift register unit of FIG. 1, in the shift register unit provided in FIG. 6, in the output phase, the voltage at the pull-up node PU significantly rises, and the electrical leakage at the pull-up node PU in a high voltage holding portion is reduced, which facilitates reducing a delay of the signal at the first signal output terminal OUT1. With the shift register unit according to the embodiment of the present disclosure, leakage current of the transistors related to the electrical leakage at the pull-up node PU may be reduced, alleviating the electrical leakage at the pull-up node PU, and thus improving the stability of the output signal of the shift register unit.

Figure 12:
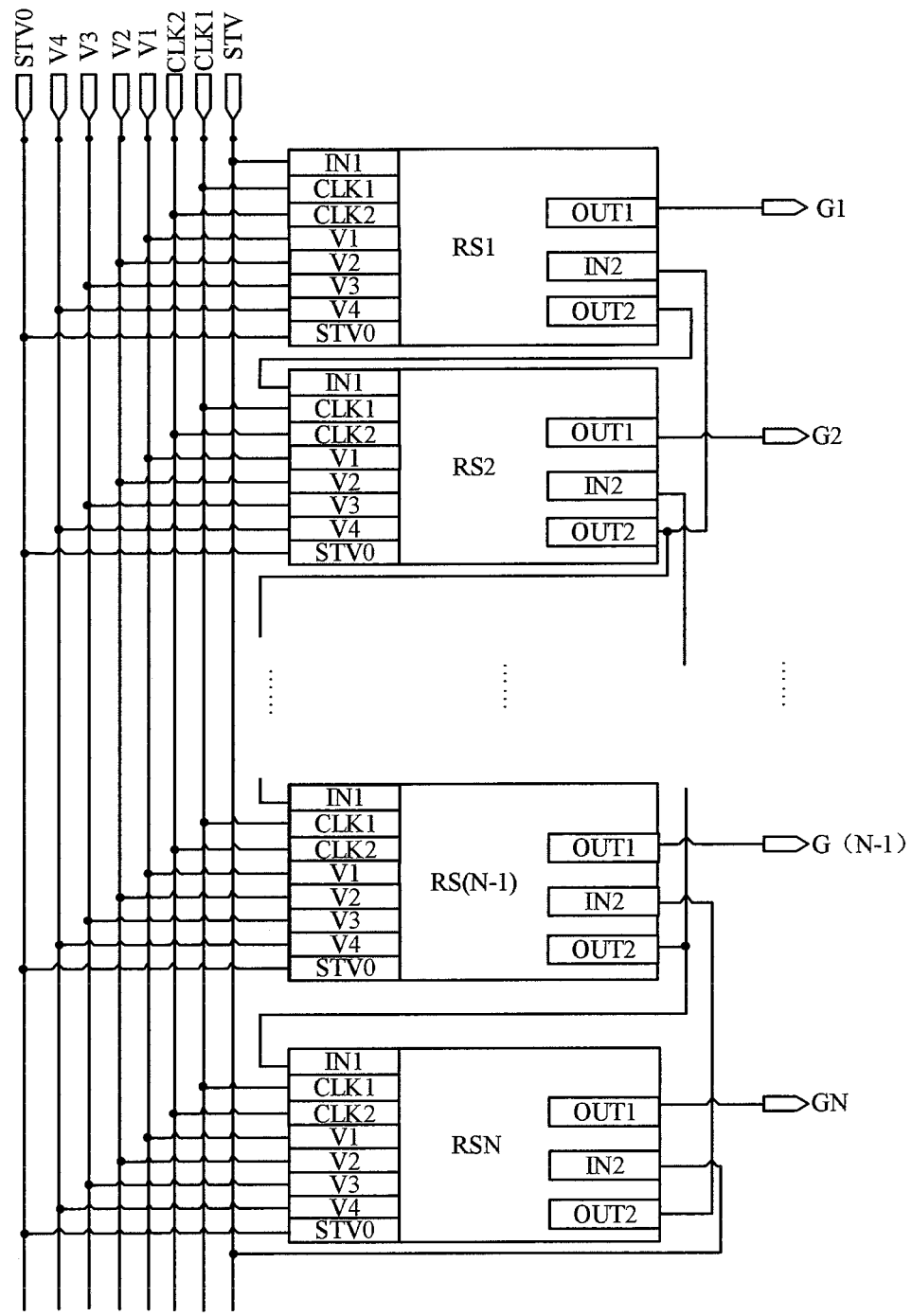
FIG. 12 is a schematic structural diagram of a gate driving circuit according to an embodiment of the present disclosure.

The embodiments of the present disclosure further provide a gate driving circuit. As shown in FIG. 12, the gate driving circuit comprises at least N stages of cascaded shift register units (RS1, RS2, ..., RSN) as described above, where N is an integer greater than 1.

A first signal input terminal IN1 of a first stage of shift register unit RS1 is connected to a start signal terminal STV. Except for the first stage of shift register unit RS1, a first signal input terminal IN1 of each stage of shift register unit (an $n^{th}$ stage of shift register unit RS(n)) is connected to a second signal output terminal OUT2 of a previous stage of shift register unit (an $(n-1)^{th}$ stage of shift register unit RS(n-1)). Except for a last stage of shift register unit RSN, a second signal input terminal IN2 of each stage of shift register unit (an $n^{th}$ stage of shift register unit RS(n)) is connected to a second signal output terminal OUT2 of a next stage of shift register unit (an $(n+1)^{th}$ stage of shift register unit RS(n+1)). A second signal input terminal IN2 of the last stage of shift register unit RSN is connected to the start signal terminal STV, where $2 \leq n \leq N$.

In this way, when a start signal at the start signal terminal STV is input at the first signal input terminal IN1 of the first stage of shift register unit RS1, the second signal input terminal IN2 of the last stage of shift register unit RSN may use the start signal at the start signal terminal STV as a signal at the second signal input terminal IN2 to reset the first signal output terminal OUT1 and the second signal output terminal OUT2 of the last stage of shift register unit RSN. In some embodiments, the second signal input terminal IN2 of the last stage of shift register unit RSN may also be connected to a separate initialization signal terminal.

Here, the gate driving circuit comprises a plurality of shift register units, which may be in the reset phase P0 at the same time.

The embodiments of the present disclosure further provide a display apparatus comprising the gate driving circuit described above. In the embodiment of the present disclosure, the display apparatus may specifically comprise at least a liquid crystal display panel or an organic light emitting diode display panel, for example, the display panel may be applied to any product or component having a display function, such as a liquid crystal display, a liquid crystal television, a digital photo frame, a mobile phone, or a tablet computer etc.

The embodiments of the present disclosure further provide a method for driving any of the shift register units described above.

In a case where the shift register unit comprises the reset sub-circuit 50, the method for driving a shift register unit comprises the following steps.

In a reset phase P0,
the reset sub-circuit 50 is turned on under control of the reset signal terminal STV0, to transmit a turn-off signal (low level) at the first signal input terminal IN1 to the pull-up node PU to reset the pull-up node PU.

In a case where a structure of each sub-circuit in the above shift register unit is as shown in FIG. 8 and transistors in each module are N-type transistors, in the reset phase P0, the fifth transistor M5 transmits a low level signal at the first signal input terminal IN1 to the pull-up node PU under control of a high level signal at the reset signal terminal STV0, to reset the pull-up node PU.

Here, in a case where the shift register unit is applied to the gate driving circuit, the plurality of shift register units may be in the reset phase P0 at the same time.

In an input phase P1,
The first input sub-circuit 10 transmits a turn-on signal at the first signal input terminal IN1 to the pull-up node PU under control of the first signal input terminal IN1.

In a case where the structure of each sub-circuit in the above shift register unit is as shown in FIG. 8 and the transistors in each module are N-type transistors, in the input phase P1, the first transistor M1 is turned on under control of a high level signal at the first signal input terminal IN1, to transmit the high level signal at the first signal input terminal IN1 to the pull-up node PU.

In a first output phase A of an output phase P2,
Under control of the pull-up node PU, the first output sub-circuit 30 transmits a turn-on signal at the first clock signal terminal CLK1 to the first signal output terminal OUT1, and the first signal output terminal OUT1 outputs a gate scanning turn-on signal; and the second output sub-circuit 40 transmits a turn-on signal at the second clock signal terminal CLK2 to the second signal output terminal OUT2, and the second signal output terminal OUT2 outputs the turn-on signal.

In a case where the structure of each sub-circuit in the above shift register unit is as shown in FIG. 8 and the transistors in each module are N-type transistors, in the first output phase A, the first transistor M1 is turned on under control of the high level signal at the first signal input terminal IN1, to transmit the high level signal at the first signal input terminal IN1 to the pull-up node PU, and the storage capacitor C charges the pull-up node PU with the high level stored in the input phase P1. The third transistor M3 transmits a high level signal at the first clock signal terminal CLK1 to the first signal output terminal OUT1 under control of the pull-up node PU, and the first signal output terminal OUT1 outputs a gate scanning turn-on signal. The fourth transistor M4 transmits a high level signal at the second clock signal terminal CLK2 to the second signal output terminal OUT2 under control of the pull-up node PU, and the second signal output terminal OUT2 outputs a turn-on signal to a first signal input terminal IN1 of a next stage of shift register unit.

In a second output phase B of the output phase P2,
Under control of the pull-up node PU, the first output sub-circuit 30 transmits a turn-off signal (low level) at the first clock signal terminal CLK1 to the first signal output terminal OUT1, and the first signal output terminal OUT1 outputs a gate scanning turn-off signal; and the second output sub-circuit 40 transmits a turn-on signal at the second clock signal terminal CLK2 to the second signal output terminal OUT2, and the second signal output terminal OUT2 outputs the turn-on signal.

In a case where the structure of each sub-circuit in the above shift register unit is as shown in FIG. 8 and the transistors in each module are N-type transistors, in the second output phase B, the first transistor M1 is turned off under control of the low level signal at the first signal input terminal IN1, and the storage capacitor C charges the pull-up node PU with the high level stored in the input phase P1. The third transistor M3 transmits a low level signal at the first clock signal terminal CLK1 to the first signal output terminal OUT1 under control of the pull-up node PU, and the first signal output terminal OUT1 outputs a gate scanning turn-off signal. The fourth transistor M4 transmits a high level signal at the second clock signal terminal CLK2 to the second signal output terminal OUT2 under control of the pull-up node PU, and the second signal output terminal OUT2 outputs a turn-on signal to a first signal input terminal IN1 of a next stage of shift register unit.

In the output phase P2, the first pull-down node PD1 and the second pull-down node PD2 are at a low level, and the second transistor M2, the sixth transistor M6, the seventh transistor M7, the twelfth transistor M12, the thirteenth transistor M13, the eighteenth transistor M18 and the nineteenth transistor M19 are all turned off.

In a pull-down phase P3,

The second input sub-circuit transmits the turn-off signal (low level) at the first signal input terminal IN1 to the pull-up node PU under control of the second signal input terminal IN2, to control the first output sub-circuit 30 and the second output sub-circuit 40 to be turned off.

In a case where the shift register unit comprises the first de-noising sub-circuit 60 and the second de-noising sub-circuit 100, in the pull-down phase P3, the first de-noising sub-circuit 60 may also transmit the turn-off signal at the first signal input terminal IN1 to the pull-up node PU under control of the first pull-down node PD1; or the second de-noising sub-circuit 100 may also transmit the turn-off signal at the first signal input terminal IN1 to the pull-up node PU under control of the second pull-down node PD2.

In a case where the above shift register unit has the structure as shown in FIG. 8, in the pull-down phase P3, the second transistor M2 transmits the low level at the first signal input terminal IN1 to the pull-up node PU under control of the high level at the second signal input terminal IN2, to pull down the potential at the pull-up node PU to control the third transistor M3 and the fourth transistor M4 to be turned off.

In a case where the first voltage terminal V1 inputs a high level and the fourth voltage terminal V4 inputs a low level, the tenth transistor M10 is turned off under control of the low level at the pull-up node PU, and the eighth transistor M8 is turned on under control of the high level at the first voltage terminal V1, to transmit a high level signal to the gate of the ninth transistor M9 to control the ninth transistor M9 to be turned on, and the high level at the first voltage terminal V1 is transmitted to the first pull-down node PD1 through the ninth transistor M9 to pull up the potential at the first pull-down node PD1 to a high level. Under control of the first pull-down node PD1, the sixth transistor M6 is turned on to transmit the low level at the first signal input terminal IN1 to the pull-up node PU, to de-noise the pull-up node PU; the twelfth transistor M12 is turned on to transmit the low level at the third voltage terminal V3 to the first signal output terminal OUT1, to de-noise the first signal output terminal OUT1; and the thirteenth transistor M13 is turned on to transmit the low level at the second voltage terminal V2 to the second signal output terminal OUT2, to de-noise the second signal output terminal OUT2. At this time, the potential at the second pull-down node PD2 is still maintained at a low level, to control the seventh transistor M7, the eighteenth transistor M18, and the nineteenth transistor M19 to be turned off.

In a case where the first voltage terminal V1 inputs a low level and the fourth voltage terminal V4 inputs a high level, the sixteenth transistor M16 is turned off under control of the low level at the pull-up node PU, and the fourteenth transistor M14 is turned on under control of the high level at the fourth voltage terminal V4, to transmit a high level signal to the gate of the fifteenth transistor M15 to control the fifteenth transistor M15 to be turned on, and the high level at the fourth voltage terminal V4 is transmitted to the second pull-down node PD2 through the fifteenth transistor M15 to pull up the potential at the second pull-down node PD2 to a high level. Under control of the second pull-down node PD2, the seventh transistor M7 is turned on to transmit the low level at the first signal input terminal IN1 to the pull-up node PU, to de-noise the pull-up node PU; the eighteenth transistor M18 is turned on to transmit the low level at the third voltage terminal V3 to the first signal output terminal OUT1, to de-noise the first signal output terminal OUT1; and the nineteenth transistor M19 is turned on to transmit the low level at the second voltage terminal V2 to the second signal output terminal OUT2, to de-noise the second signal output terminal OUT2. At this time, the potential at the first pull-down node PD1 is still maintained at a low level, to control the sixth transistor M6, the twelfth transistor M12, and the thirteenth transistor M13 to be turned off.

The above description is only specific embodiments of the present disclosure, but the protection scope of the present disclosure is not limited thereto. Changes or substitutions which are easily reached by any skilled in the art within the technical scope of the present disclosure should be covered within the protection scope of the present disclosure. Therefore, the protection scope of the present disclosure should be determined by the protection scope of the claims.

I claim:

1. A shift register unit, comprising:
   a first input sub-circuit connected to a first signal input terminal and a pull-up node, and configured to transmit a signal at the first signal input terminal to the pull-up node under control of the first signal input terminal;
   a second input sub-circuit connected to a second signal input terminal, the first signal input terminal, and the pull-up node, and configured to transmit the signal at the first signal input terminal to the pull-up node under control of the second signal input terminal;
   a first output sub-circuit connected to the pull-up node, a first clock signal terminal, and a first signal output terminal, and configured to transmit a signal at the first clock signal terminal to the first signal output terminal under control of the pull-up node;
   a second output sub-circuit connected to the pull-up node, a second clock signal terminal, and a second signal output terminal, and configured to transmit a signal at the second clock signal terminal to the second signal output terminal under control of the pull-up node;
   a first pull-down control sub-circuit connected to the pull-up node, a first voltage terminal, a second voltage terminal, and a first pull-down node, and configured to control a level at the first pull-down node based on levels at the first voltage terminal and the second voltage terminal under control of the pull-up node;
a first pull-down sub-circuit connected to the first pull-down node, the first signal output terminal, and a third voltage terminal, and configured to transmit a signal at the third voltage terminal to the first signal output terminal under control of the first pull-down node; and
a second pull-down sub-circuit connected to the first pull-down node, the second signal output terminal, and the second voltage terminal, and configured to transmit a signal at the second voltage terminal to the second signal output terminal under control of the first pull-down node.

2. The shift register unit according to claim 1, further comprising a reset sub-circuit connected to a reset signal terminal, the first signal input terminal, and the pull-up node, and configured to transmit the signal at the first signal input terminal to the pull-up node under control of the reset signal terminal.

3. The shift register unit according to claim 1, further comprising:
a first de-noising sub-circuit connected to a first pull-down node, the pull-up node, and the first signal input terminal, and configured to transmit the signal at the first signal input terminal to the pull-up node under control of the first pull-down node.

4. The shift register unit according to claim 3, further comprising:
a second de-noising sub-circuit connected to a second pull-down node, the pull-up node, and the first signal input terminal, and configured to transmit the signal at the first signal input terminal to the pull-up node under control of the second pull-down node.

5. The shift register unit according to claim 1, further comprising:
a second pull-down control sub-circuit connected to the pull-up node, a fourth voltage terminal, the second voltage terminal, and a second pull-down node, and configured to control a level at the second pull-down node based on levels at the fourth voltage terminal and the second voltage terminal under control of the pull-up node;
a third pull-down sub-circuit connected to the second pull-down node, the first signal output terminal, and the third voltage terminal, and configured to transmit the signal at the third voltage terminal to the first signal output terminal under control of the second pull-down node; and
a fourth pull-down sub-circuit connected to the second pull-down node, the second signal output terminal, and the second voltage terminal, and configured to output the signal at the second voltage terminal to the second signal output terminal under control of the second pull-down node.

6. The shift register unit according to claim 1, wherein the first input sub-circuit comprises a first transistor having a gate connected to the first signal input terminal, a first electrode connected to the first signal input terminal, and a second electrode connected to the pull-up node.

7. The shift register unit according to claim 1, wherein the second input sub-circuit comprises a second transistor having a gate connected to the second signal input terminal, a first electrode connected to the pull-up node, and a second electrode connected to the first signal input terminal.

8. The shift register unit according to claim 1, wherein the first output sub-circuit comprises a third transistor and a storage capacitor, wherein
the third transistor has a gate connected to the pull-up node, a first electrode connected to the first clock signal terminal, and a second electrode connected to the first signal output terminal; and
the storage capacitor has a first terminal connected to the pull-up node, and a second terminal connected to the first signal output terminal.

9. The shift register unit according to claim 1, wherein the second output sub-circuit comprises a fourth transistor having a gate connected to the pull-up node, a first electrode connected to the second clock signal terminal, and a second electrode connected to the second signal output terminal.

10. The shift register unit according to claim 2, wherein the reset sub-circuit comprises a fifth transistor, wherein
the fifth transistor has a gate connected to the reset signal terminal, a first electrode connected to the pull-up node, and a second electrode connected to the first signal input terminal.

11. The shift register unit according to claim 3, wherein the first de-noising sub-circuit comprises a sixth transistor having a gate connected to the first pull-down node, a first electrode connected to the pull-up node, and a second electrode connected to the first signal input terminal.

12. The shift register unit according to claim 4, wherein the second de-noising sub-circuit comprises a seventh transistor having a gate connected to the second pull-down node, a first electrode connected to the pull-up node, and a second electrode connected to the first signal input terminal.

13. The shift register unit according to claim 1, wherein the first pull-down control sub-circuit comprises an eighth transistor, a ninth transistor, a tenth transistor, and an eleventh transistor, the first pull-down sub-circuit comprises a twelfth transistor, and the second pull-down sub-circuit comprises a thirteenth transistor, wherein
the eighth transistor has a gate connected to the first voltage terminal, a first electrode connected to the first voltage terminal, and a second electrode connected to a gate of the ninth transistor and a first electrode of the tenth transistor;
the ninth transistor has the gate also connected to the first electrode of the tenth transistor, a first electrode connected to the first voltage terminal, and a second electrode connected to the first pull-down node;
the tenth transistor has a gate connected to the pull-up node, and a second electrode connected to the second voltage terminal;
the eleventh transistor has a gate connected to the pull-up node, a first electrode connected to the first pull-down node, and a second electrode connected to the second voltage terminal;
the twelfth transistor has a gate connected to the first pull-down node, a first electrode connected to the first signal output terminal, and a second electrode connected to the third voltage terminal; and
the thirteenth transistor has a gate connected to the first pull-down node, a first electrode connected to the second signal output terminal, and a second electrode connected to the second voltage terminal.

14. The shift register unit according to claim 5, wherein the second pull-down control sub-circuit comprises a fourteenth transistor, a fifteenth transistor, a sixteenth transistor, and a seventeenth transistor, the third pull-down sub-circuit comprises an eighteenth transistor, and the fourth pull-down sub-circuit comprises a nineteenth transistor, wherein
the fourteenth transistor has a gate connected to the fourth voltage terminal, a first electrode connected to the fourth voltage terminal, and a second electrode connected to a gate of the fifteenth transistor;
the fifteenth transistor has the gate also connected to a first electrode of the sixteenth transistor, a first electrode connected to the fourth voltage terminal, and a second electrode connected to the second pull-down node;
the sixteenth transistor has a gate connected to the pull-up node, and a second electrode connected to the second voltage terminal;
the seventeenth transistor has a gate connected to the pull-up node, a first electrode connected to the second pull-down node, and a second electrode connected to the second voltage terminal;
the eighteenth transistor has a gate connected to the second pull-down node, a first electrode connected to the first signal output terminal, and a second electrode connected to the third voltage terminal; and
the nineteenth transistor has a gate connected to the second pull-down node, a first electrode connected to the second signal output terminal, and a second electrode connected to the second voltage terminal.

15. A gate driving circuit, comprising N stages of cascaded shift register units according to claim 1, wherein
a first signal input terminal of an $n^{th}$ stage of shift register unit is connected to a second signal output terminal of an $(n-1)^{th}$ stage of shift register unit, and a second signal input terminal of the $n^{th}$ stage of shift register unit is connected to a second signal output terminal of an $(n+1)^{th}$ stage of shift register unit; and
a first clock signal terminal of the $n^{th}$ stage of shift register unit is connected to receive a first clock signal, and a second clock signal terminal of the $n^{th}$ stage of shift register unit is connected to receive a second clock signal,
where n and N are integers greater than 1, and $2 \leq n \leq N-1$.

16. A display apparatus, comprising the gate driving circuit according to claim 15.

17. A method for driving the shift register unit according to claim 1, comprising:
in an input phase, applying a first input signal at a first level to the first signal input terminal, so that the first input sub-circuit transmits the first level at the first signal input terminal to the pull-up node;
in a first output phase, applying a first clock signal at the first level to the first clock signal terminal, and applying a second clock signal at the first level to the second clock signal terminal, so that the first output sub-circuit transmits the first level at the first clock signal terminal to the first signal output terminal and the second output sub-circuit transmits the first level at the second clock signal terminal to the second signal output terminal under action of a potential at the pull-up node;
in a second output phase in which the input signal becomes a second level, the first clock signal becomes the second level, and the second clock signal is maintained at the first level, transmitting, by the first output sub-circuit, the second level at the first clock signal terminal to the first signal output terminal and transmitting, by the second output sub-circuit, the first level at the second clock signal terminal to the second signal output terminal under action of the potential at the pull-up node; and
in a pull-down phase in which the second clock signal becomes the second level, applying a second input signal at the first level to the second signal input terminal, so that the second input sub-circuit inputs the second level at the first signal input terminal to the pull-up node, and the first output sub-circuit and the second output sub-circuit are turned off under action of the potential at the pull-up node.

18. The method for driving a shift register unit according to claim 17, wherein the shift register unit comprises a reset sub-circuit, and the method for driving a shift register unit further comprises:
in a reset phase in which the first input signal at the first signal input terminal is at the second level, applying a reset signal at the first level to the reset signal terminal, so that the reset sub-circuit transmits the second level at the first signal input terminal to the pull-up node, and the first output sub-circuit and the second output sub-circuit are turned off under action of the potential at the pull-up node.

19. The method for driving a shift register unit according to claim 17, wherein
the shift register unit comprises a first de-noising sub-circuit, and the method further comprises: in the pull-down phase, transmitting, by the first de-noising sub-circuit, the second level at the first signal input terminal to the pull-up node under control of the first pull-down node; or
the shift register unit comprises a first de-noising sub-circuit and a second de-noising sub-circuit, and the method further comprises: in the pull-down phase, transmitting, by the first de-noising sub-circuit, the second level at the first signal input terminal to the pull-up node under control of the first pull-down node; or transmitting, by the second de-noising sub-circuit, the second level at the first signal input terminal to the pull-up node under control of the second pull-down node.

* * * * *